(12) United States Patent
Yoon

(10) Patent No.: US 7,915,074 B2
(45) Date of Patent: Mar. 29, 2011

(54) THIN FILM TRANSISTOR ARRAY PANEL AND MANUFACTURING METHOD THEREOF

(75) Inventor: Soo-Wan Yoon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 982 days.

(21) Appl. No.: 11/739,753

(22) Filed: Apr. 25, 2007

(65) Prior Publication Data

US 2007/0252142 A1 Nov. 1, 2007

(30) Foreign Application Priority Data

Apr. 26, 2006 (KR) .................. 10-2006-0037563

(51) Int. Cl.
*H01L 51/40* (2006.01)
*H01L 29/08* (2006.01)
*H01L 29/18* (2006.01)

(52) U.S. Cl. .............. 438/99; 438/951; 257/40; 257/88; 257/E33.065; 257/E51.018; 257/E51.033

(58) Field of Classification Search .................. 438/99, 438/951; 257/40, 88, E33.065, E51.018, 257/E51.022
See application file for complete search history.

(56) References Cited

U.S. PATENT DOCUMENTS

| 6,593,977 | B2 | 7/2003 | Ishihara et al. |
| 2005/0024550 | A1* | 2/2005 | Kim ................................ 349/43 |
| 2005/0221546 | A1* | 10/2005 | Lee et al. ...................... 438/158 |
| 2005/0270434 | A1* | 12/2005 | Jung et al. ........................ 349/43 |
| 2006/0033099 | A1* | 2/2006 | Chung et al. ..................... 257/40 |
| 2006/0160279 | A1* | 7/2006 | Park et al. ...................... 438/149 |
| 2006/0262256 | A1* | 11/2006 | Kim .............................. 349/114 |

FOREIGN PATENT DOCUMENTS

| JP | 2001244467 | 9/2001 |
| JP | 2004023021 | 1/2004 |
| JP | 2004281477 | 10/2004 |
| KR | 1020040049110 | 6/2004 |
| KR | 1020050023012 | 3/2005 |
| KR | 1020050070779 | 7/2005 |
| KR | 1020050077525 | 8/2005 |
| KR | 1020050080503 | 8/2005 |
| KR | 1020050094509 | 9/2005 |

* cited by examiner

*Primary Examiner* — Hsien-ming Lee
*Assistant Examiner* — Kevin Parendo
(74) *Attorney, Agent, or Firm* — Cantor Colburn LLP

(57) ABSTRACT

A method of manufacturing a thin film transistor ("TFT") array panel includes forming a first conductive layer, gate insulating layer, and first insulating layer on a substrate, patterning the first insulating layer to form a first insulating pattern including an opening, etching the gate insulating layer and first conductive layer to form a gate insulating member and a gate line, forming an organic semiconductor in the opening, forming a passivation layer and a second insulating pattern thereon, patterning the second insulating layer to form a second insulating pattern, etching the passivation layer, depositing a second conductive layer thereon, forming a pixel electrode by removing the second insulating pattern and the second conductive layer deposited on the second insulating pattern, and forming a drain electrode and a data line by depositing and patterning a third conductive layer on the resultant structure.

12 Claims, 15 Drawing Sheets

THIN FILM TRANSISTOR ARRAY PANEL AND MANUFACTURING METHOD THEREOF

This application claims priority to Korean Patent Application No. 10-2006-0037563, filed on Apr. 26, 2006, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor ("TFT") array panel and a manufacturing method thereof. More particularly, the present invention relates to a TFT array panel and a method of manufacturing TFT array panels with a reduced number of masks.

(b) Description of the Related Art

Flat panel displays such as a liquid crystal display ("LCD"), an organic light emitting device ("OLED"), and an electrophoretic display includes several pairs of field generating electrodes and electro-optical active layers interposed there between. The LCD includes a liquid crystal layer as the electro-optical active layer, and the OLED includes an organic emission layer as the electro-optical active layer.

One electrode within each pair of field generating electrodes, i.e., a pixel electrode, is commonly connected to a switching element for transmitting signals to the pixel electrode, and the electro-optical active layer converts the electrical signals to optical signals to display images.

TFTs having three terminals are used as the switching elements in a flat panel display, and the flat panel display also includes gate lines for transmitting gate signals to control the TFTs and data lines for transmitting signals to be applied to the pixel electrodes.

Among TFTs, organic TFTs ("OTFTs") using an organic semiconductor instead of an inorganic semiconductor such as silicon Si, have been vigorously researched.

Moreover, since an OTFT may be fabricated in the form of a fiber or a film due to the flexible characteristics of the organic material, it has been in the spotlight as a core element of a flexible display device.

The OTFT may be fabricated by a solution process such as inkjet printing, and therefore the OTFT may be easily applied to a large-sized flat panel display.

However, the OTFT has a different structure and manufacturing process from other TFTs, including an inorganic semiconductor, since the organic semiconductor has lower field effect mobility and lower stability than those of the inorganic semiconductor. In this case, the number of masks required to manufacture an OTFT increases, and so the manufacturing cost thereof is increased.

BRIEF SUMMARY OF THE INVENTION

The present invention has been made in an effort to provide an organic thin film transistor ("OTFT") array panel and a manufacturing method thereof having advantages of reducing the number of masks to form an OTFT.

According to exemplary embodiments of the present invention, a manufacturing method of a thin film transistor ("TFT") array panel includes forming a first conductive layer on a substrate, forming a gate insulating layer on the first conductive layer, forming a first insulating layer on the gate insulating layer, forming a first insulating pattern including an opening by patterning the first insulating layer, forming a gate insulating member and a gate line by etching the gate insulating layer and the first conductive layer using the first insulating pattern as a mask, forming an organic semiconductor in the opening, forming a passivation layer and a second insulating layer on the organic semiconductor and the first insulating pattern sequentially, forming a second insulating pattern by patterning the second insulating layer, etching the passivation layer using the second insulating pattern as a mask, depositing a second conductive layer on the second insulating pattern and on portions exposed through openings of the second insulating pattern and etched passivation layer, forming a pixel electrode by removing the second insulating pattern and the second conductive layer located on the second insulating pattern, and forming a data line including a source electrode, and a drain electrode facing the source electrode by depositing a third conductive layer and patterning the third conductive layer by photolithography and etching.

Forming the first insulating pattern may include forming first portions and second portions thinner than the first portions by patterning the first insulating layer, and forming openings by removing the second portions. Forming the first portions and the second portions may include using a slit mask or a halftone mask, and forming the openings may include removing the second portions by ashing.

The first insulating layer may be thicker than the first insulating pattern.

Forming the pixel electrode may include removing the second insulating pattern and the second conductive layer located on the second insulating pattern by lift-off.

Forming the second insulating pattern may include forming first portions and second portions thinner than the first portions by patterning the second insulating layer, and removing the second portions. Forming the first portions and the second portions may include using a slit mask or a half-tone mask.

Forming the organic semiconductor may include an inkjet printing process.

The first insulating layer and the second insulating layer may include a photosensitive organic material, where the first insulating layer may include a negative photosensitive organic material and the second insulating layer may include a positive photosensitive organic material.

Depositing the second conductive layer may be performed at room temperature.

According to other exemplary embodiments of the present invention, a manufacturing method of a TFT array panel includes forming a gate line on a substrate, forming an organic semiconductor on the gate line, forming a partition surrounding the organic semiconductor, forming a data line including a source electrode contacting the organic semiconductor, and forming a drain electrode, and forming a pixel electrode connected to the drain electrode. The gate line and the partition may be formed using a first mask, the pixel electrode may be formed using a second mask, and the data line and the drain electrode may be formed using a third mask.

The method of manufacturing a TFT array panel may further include forming a gate insulating member disposed between the gate line and the organic semiconductor. The gate insulating member may be formed using the first mask.

The method of manufacturing a TFT array panel may further include forming a passivation layer on the source electrode and the drain electrode or under the source electrode and the drain electrode. The passivation layer may be formed using the second mask.

The organic semiconductor may be formed by inkjet printing.

Forming the pixel electrode may include forming the pixel electrode directly on the substrate.

The method may further include forming connecting members connecting the source electrode to the organic semiconductor and connecting the drain electrode to the organic semiconductor. The connecting members may be separated from each other and formed during formation of the pixel electrode.

According to still other exemplary embodiments of the present invention, a TFT array panel includes a substrate, a gate line formed on the substrate, a gate insulating member formed on the gate line, a partition formed on the gate insulating member and including a first opening, an organic semiconductor formed in the opening, a source electrode and a drain electrode connected to the organic semiconductor, respectively, a data line intersecting the gate line and connected to the source electrode, a pixel electrode connected to the drain electrode, and a passivation layer formed on the data line and the drain electrode or under the data line and the drain electrode. The passivation layer has a second opening, a third opening, and a fourth opening. The pixel electrode and the passivation layer do not overlap each other.

The gate insulating member may include a contact hole and the gate insulating member may have substantially a same planar shape as the gate line except for the contact hole.

The second and third openings may expose a portion of the organic semiconductor, respectively. The TFT array panel may further include connecting members formed on the exposed organic semiconductor, respectively. The connecting members may connect the organic semiconductor and the source electrode and the organic semiconductor and the drain electrode, respectively. The connecting members may include a same material as the pixel electrode, such as indium tin oxide ("ITO") or indium zinc oxide ("IZO"). The connecting members may be separated from each other and may partially overlap the partition, and a portion of the passivation layer may be formed on the organic semiconductor between the connecting members.

The TFT array panel may further include a storage electrode line substantially parallel to the gate line, and a conductor overlapping the storage electrode line and connected to the pixel electrode.

The pixel electrode may contact the substrate.

The partition may overlap a gate electrode of the gate line, the opening in the partition may expose a portion of the gate insulating member overlapping the gate electrode, and a thickness of the organic semiconductor may be less than a thickness of the partition.

BRIEF DESCRIPTION OF THE DRAWINGS

The above and other aspects, features and advantages of the present invention will become more apparent by describing in more detail exemplary embodiments thereof with reference to the accompanying drawings, in which.

DETAILED DESCRIPTION OF THE INVENTION

Figure 1:
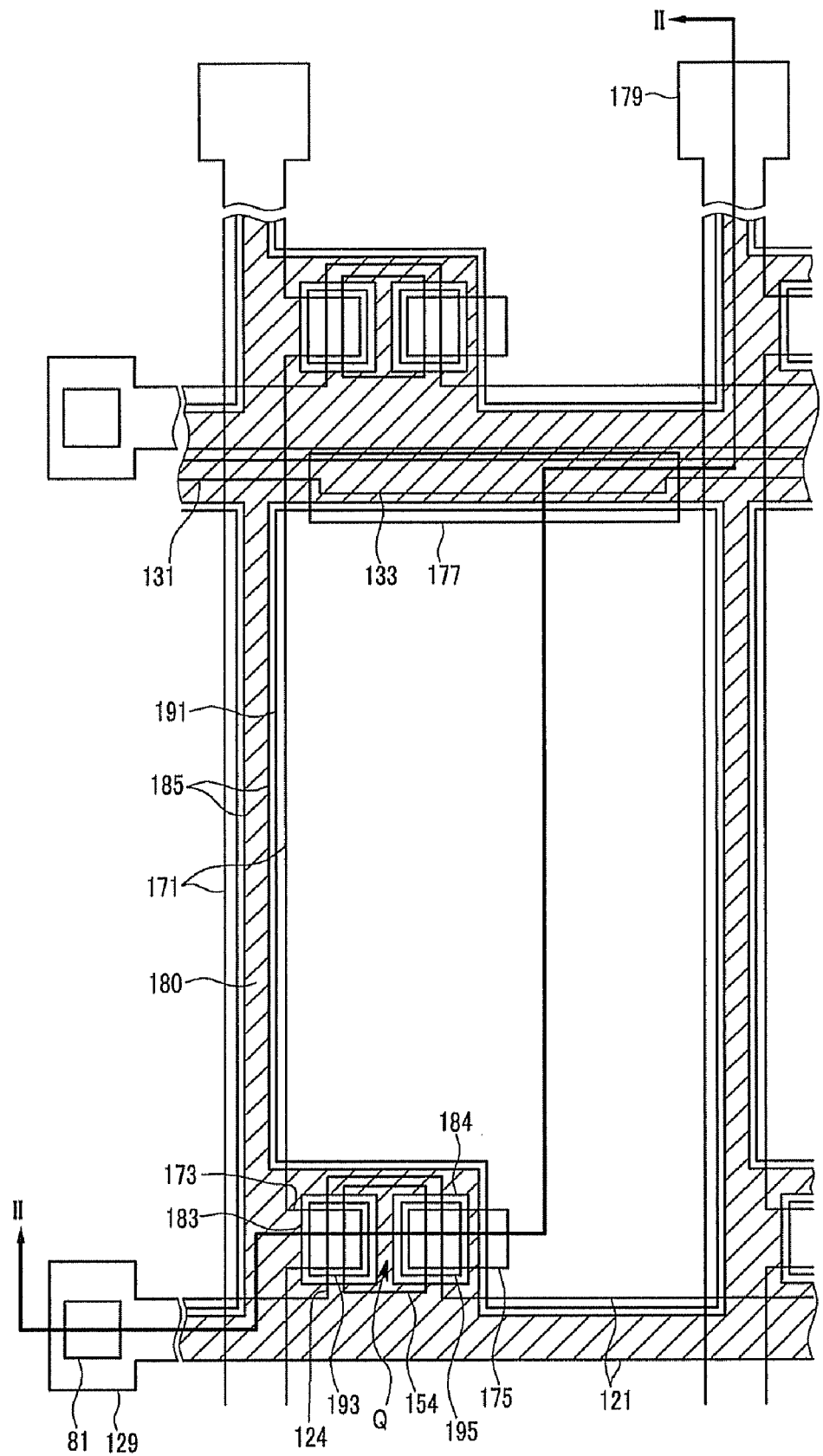
FIG. 1 is a layout view of an exemplary thin film transistor ("TFT") array panel according to an exemplary embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

A thin film transistor ("TFT") array panel according to an exemplary embodiment of the present invention will be described in detail with reference to FIGS. 1 and 2.

Figure 2:
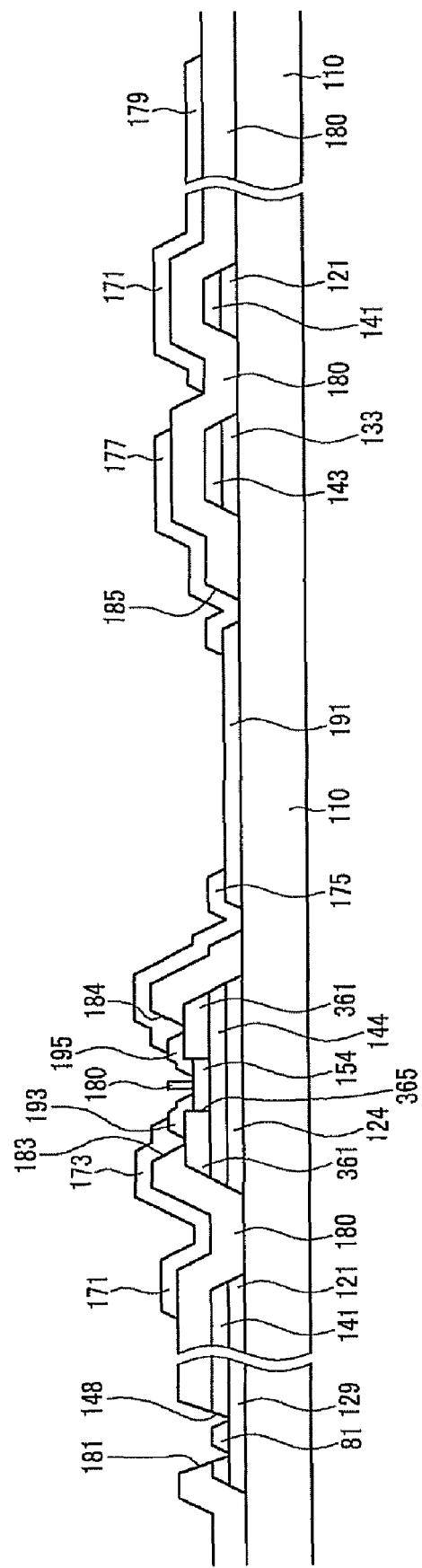
FIG. 2 is a sectional view of the exemplary TFT array panel shown in FIG. 1 taken along line II-II.

FIG. 1 is a layout view of an exemplary TFT array panel according to an exemplary embodiment of the present invention, and FIG. 2 is a sectional view of the exemplary TFT array panel shown in FIG. 1 taken along line II-II.

A plurality of gate lines 121 and a plurality of storage electrode lines 131 are formed on an insulating substrate 110 made of a material such as transparent glass, silicone, or plastic.

The gate lines 121 transmit gate signals and extend substantially in a transverse direction, a first direction. Each gate line 121 includes a plurality of gate electrodes 124 projecting upward, toward an adjacent gate line 121, and an end portion 129 having a large area for contact with another layer or an external driving circuit. A gate driving circuit (not shown) for generating the gate signals may be mounted on a flexible printed circuit ("FPC") film (not shown), which may be attached to the substrate 110, directly mounted on the substrate 110, or integrated onto the substrate 110. The gate lines 121 may extend to be connected to a driving circuit that may be integrated on the substrate 110.

The storage electrode lines 131 are supplied with a predetermined voltage and extend substantially parallel to the gate lines 121. Each of the storage electrode lines 131 is disposed between two adjacent gate lines 121 and may be closer to the upper gate line 121 of the two adjacent gate lines 121. Each of the storage electrode lines 131 includes a storage electrode 133 expanding downward, towards gate line 121. While a particular shape and arrangement is illustrated and described, the storage electrode lines 131 may have various shapes and arrangements within the scope of these embodiments.

The gate lines 121 and the storage electrode lines 131 are preferably made of an aluminum Al-containing metal such as Al and an Al alloy, a silver Ag-containing metal such as Ag and an Ag alloy, a copper Cu-containing metal such as Cu and a Cu alloy, a molybdenum Mo-containing metal such as Mo and a Mo alloy, chromium Cr, tantalum Ta, or titanium Ti. However, they may have a multi-layered structure including two conductive films (not shown) having different physical characteristics.

The lateral sides of the gate lines 121 and the storage electrode lines 131 are inclined relative to a surface of the substrate 110, and the inclination angle thereof ranges between about 30 degrees to about 80 degrees.

A plurality of gate insulating members 141, 144, and 143 are formed on the gate lines 121, the gate electrodes 124, and the storage electrode lines 131, respectively. The gate insulating members 141 are formed on the gate lines 121, the gate insulating members 144 are portions of the gate insulating members 141 located on the gate electrodes 124, and the gate insulating members 143 are formed on the storage electrode lines 131 and storage electrodes 133.

The gate insulating members 141 have a plurality of contact holes 148 exposing the end portions 129 of the gate lines 121.

A plurality of photoresist patterns 361 is formed on the gate electrodes 124. The photoresist patterns 361 may be made of a negative photosensitive insulating material, and the thickness thereof may be about 5,000 angstroms Å to about 4 micrometers μm. The photoresist patterns 361 have a plurality of first openings 365. The first openings 365 expose the gate insulating members 144.

A plurality of organic semiconductor islands 154 is formed in the first openings 365 on the gate insulating members 144. In this case, the photoresist patterns 361 are used as a partition confining the organic semiconductor islands 154.

The height of the photoresist patterns 361 is higher than that of the organic semiconductor islands 154 such that the photoresist patterns 361 serve as banks to surround the organic semiconductor islands 154. Therefore, the photoresist patterns 361 prevent the organic semiconductor islands 154 from being damaged by penetration of chemicals in subsequent manufacturing processes.

The organic semiconductor islands 154 may include a high molecular compound or a low molecular compound soluble in an aqueous solution or an organic solvent.

The organic semiconductor islands 154 may be made of derivatives of tetracene or pentacene with a substituent. Alternatively, the organic semiconductor islands 154 may be made of oligothiophene including four to eight thiophenes connected at the positions 2, 5 of thiophene rings.

The organic semiconductor islands 154 may be made of polythienylenevinylene, poly 3-hexylthiophene, polythiophene, phthalocyanine, metallized phthalocyanine, or their halogenated derivatives. The organic semiconductor islands 154 may be made of peryienetetracarboxylic dianhydride ("PTCDA"), naphthalenetetracarboxylic dianhydride ("NTCDA"), or their imide derivatives. The organic semiconductor island 154 may be made of perylene, coronene, or derivatives thereof with a substituent.

The thickness of the organic semiconductor islands 154 may be about 300 Å to 3,000 Å.

A passivation layer 180 is formed on the organic semiconductor islands 154 and the gate insulating members 141, 144, and 143. The passivation layer 180 may be further formed on exposed portions of the insulating substrate 110. The passivation layer 180 is preferably made of an inorganic insulating material such as silicon nitride (SiNx) or silicon oxide (SiOx), or an organic insulating material such as polyimide, and the passivation layer 180 covers the gate lines 121 and the organic semiconductor islands 154 to protect the TFTs. Additionally, the passivation layer 180 is also formed on the end portions 129 of the gate lines 121 to prevent the end portions 129 of the gate lines 121 from shorting to the adjacent gate lines 121.

The passivation layer 180 has a plurality of second and third openings 183 and 184 exposing a portion of the organic semiconductor islands 154 and a portion of the photoresist patterns 361, a plurality of fourth openings 185 located between the gate lines 121, and a plurality of contact holes 181 exposing the end portions 129 of the gate lines 121.

A plurality of connecting members 193 and 195 are respectively formed in the second and third openings. The connecting members 193 and 195 cover the exposed portion of the organic semiconductor islands 154 and the photoresist patterns 361 and are spaced from each other.

A plurality of pixel electrodes 191 are formed in the fourth openings 185 on the substrate 110, and a plurality of contact assistants 81 are formed in the contact holes 181 on the end portions 129 of the gate lines 121 Here, edges of the pixel electrodes 191 and the contact assistants 81 may substantially be disposed at the same location as edges of the contact holes 181 and 185. Alternatively, edges of the pixel electrodes 191 and the contact assistants 81 may be disposed at a predetermined distance to edges of the contact holes 181 and 185, considering an undercut in etching the passivation layer 180.

The connecting members 193 and 195, the pixel electrodes 191, and the contact assistants 81 may be made of a transparent conductive material such as indium tin oxide ("ITO") or indium zinc oxide ("IZO"), or an opaque conductor such as a reflecting metal.

The thickness of the connecting members 193 and 195, the pixel electrodes 191, and the contact assistants 81 is about 300 to 2,000 Å.

A plurality of data lines 171, a plurality of drain electrodes 175, and a plurality of storage capacitor conductors 177 are formed on the organic semiconductor islands 154, the connecting members 193 and 195, and the passivation layer 180.

The data lines 171 transmit data signals and extend substantially in a longitudinal direction, a second direction, to intersect the gate lines 121 and the storage electrodes line 131. Each data line 171 includes a plurality of source electrodes 173 projecting sidewards, towards an adjacent data line 171, and an end portion 179 having a large portion for contact with another layer or an external driving circuit. A data driving circuit (not shown) for generating the data signals may be mounted on an FPC film (not shown), which may be attached to the substrate 110, directly mounted on the substrate 110, or integrated onto the substrate 110. The data lines 121 may extend to be connected to a driving circuit that may be integrated on the substrate 110.

The source electrode 173 is extended from the data line 171, is formed on the passivation 180 and a portion of the connecting member 193, and is connected to the organic semiconductor island 154 through the connecting member 193. The drain electrodes 175 is formed on the passivation 180 and a portion of the connecting member 195 and is connected to the organic semiconductor island 154 through the connecting member 195. The drain electrode 175 and the source electrodes 173 are located opposite each other with respect to the organic semiconductor islands 154 and the passivation layer 180 is interposed there between. The drain electrodes 175 are connected to the pixel electrodes 191.

The connecting members 193 and 195 reduce Schottky barriers, which are metal to semiconductor junctions, between the organic semiconductor islands 154 and the source electrodes 173, and between the organic semiconductor islands 154 and the drain electrodes 175 to enhance injection and transference of carriers.

The connecting members 193 and 195 may be made of a material having a similar work function as the organic semiconductor islands 154, such as ITO or IZO, and the connecting members 193 and 195 may be made within a same layer of the TFT array panel as the pixel electrodes 191.

The source electrodes 173 and the drain electrodes 175 partially overlap the gate electrodes 124.

The storage capacitor conductors 177 are separated from the data lines 171. The storage capacitor conductors 177 are connected to the pixel electrodes 191 and overlap the storage electrodes 133.

The data lines 171, the drain electrodes 175, and the storage capacitor conductors 177 are preferably made of a low resistivity conductor like the gate lines 121 and the storage electrode lines 131.

The lateral sides of the data lines 171, the drain electrodes 175, and the storage capacitor conductors 177 are also inclined relative to a surface of the substrate 110, and the inclination angle thereof ranges between about 30 degrees to about 80 degrees.

The gate electrode 124, the source electrode 173, and the drain electrode 175 along with the organic semiconductor island 154 form a TFT Q having a channel formed in the organic semiconductor island 154 between the source electrode 173 and the drain electrode 175. Although not shown, the channel of the TFT Q between the source electrode 173 and the drain electrode 175 may have a serpentine shape to increase the width of the channel such that the TFT may have good current characteristics.

The pixel electrodes 191 receive data voltages from the TFTs Q. The pixel electrodes 191 supplied with the data voltages generate electric fields in cooperation with a common electrode (not shown) of an opposing display panel (not shown) supplied with a common voltage, which determine the orientations of liquid crystal molecules (not shown) of a liquid crystal layer (not shown) disposed between the pixel electrodes and common electrode.

A pixel electrode 191 and the common electrode form a capacitor referred to as a "liquid crystal capacitor," which stores applied voltages after the TFT turns off.

A pixel electrode 191 and a conductor as a storage capacitor 177 electrically connected thereto overlap the storage electrode line 131 including the storage electrode 133 to form an additional capacitor, referred to as a "storage capacitor," which enhances the voltage storing capacity of the liquid crystal capacitor.

Now, an exemplary manufacturing method of the exemplary TFT array panel shown in FIG. 1 and FIG. 2 will be described in detail referring to FIG. 3 to FIG. 15.

Figure 3:
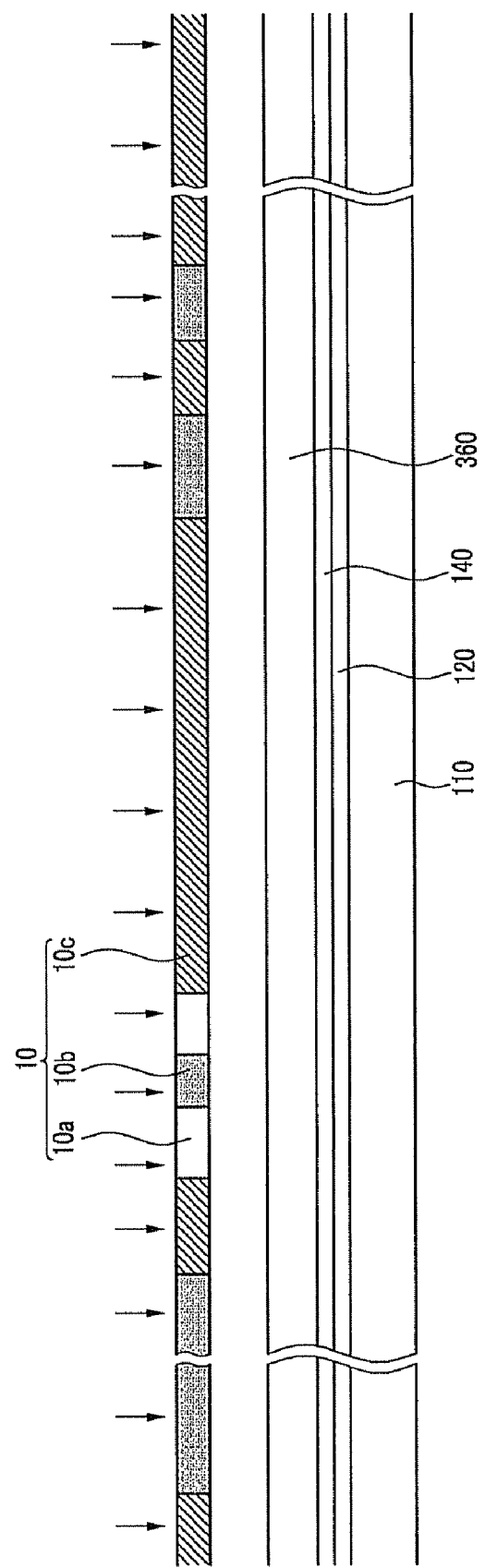
FIG. 3 and FIG. 4 are cross-sectional views sequentially illustrating an exemplary method of manufacturing the exemplary TFT array panel shown in FIG. 1 and FIG. 2 according to an exemplary embodiment of the present invention.
Figure 4:
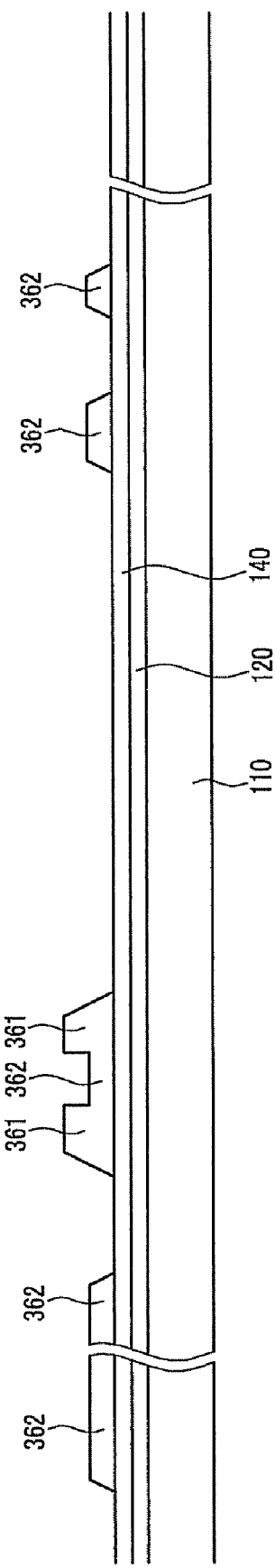
Figure 5:
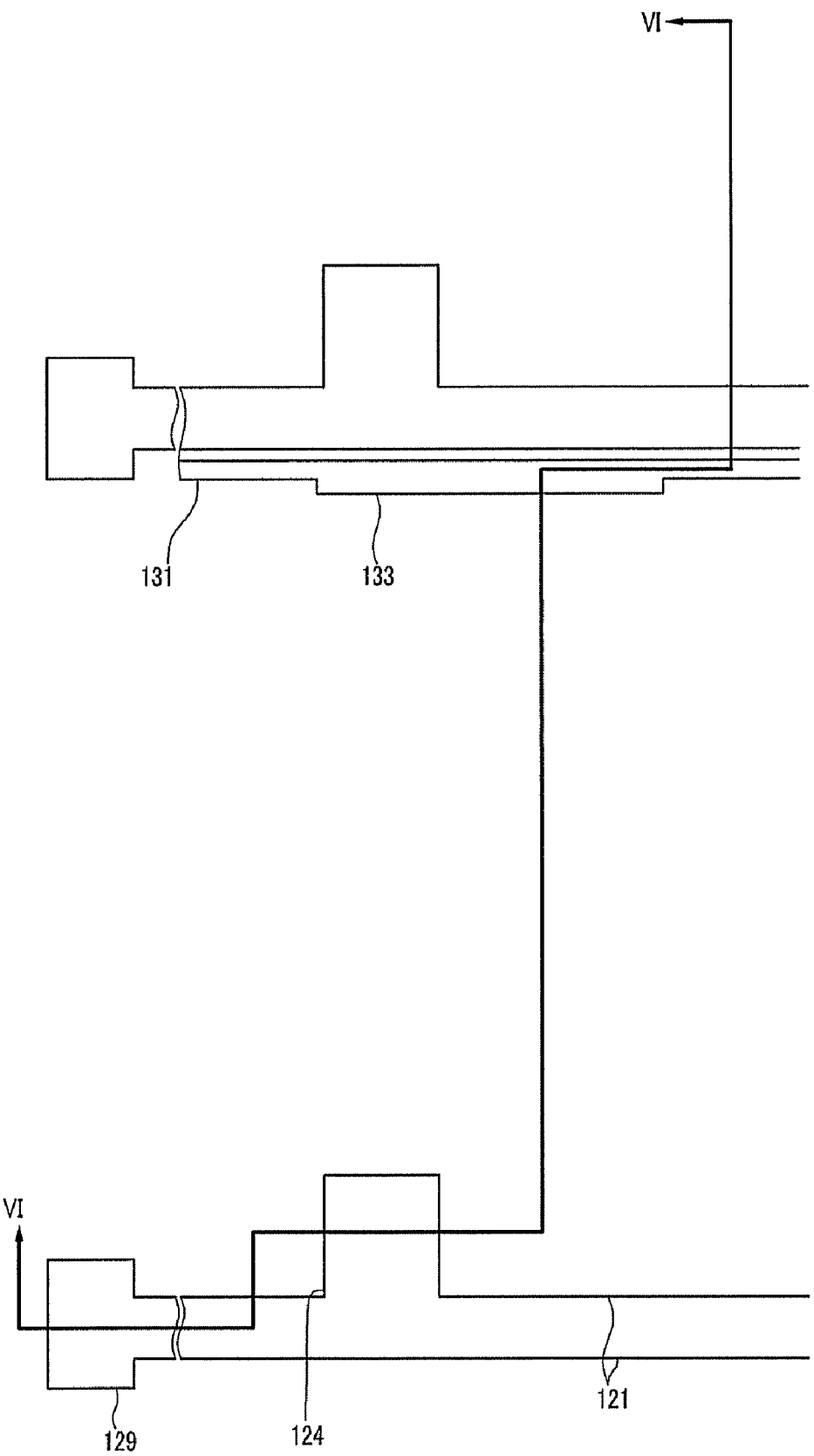
FIG. 5, FIG. 8, and FIG. 14 are layout views sequentially illustrating an exemplary method of manufacturing the exemplary TFT array panel shown in FIG. 4.
Figure 6:
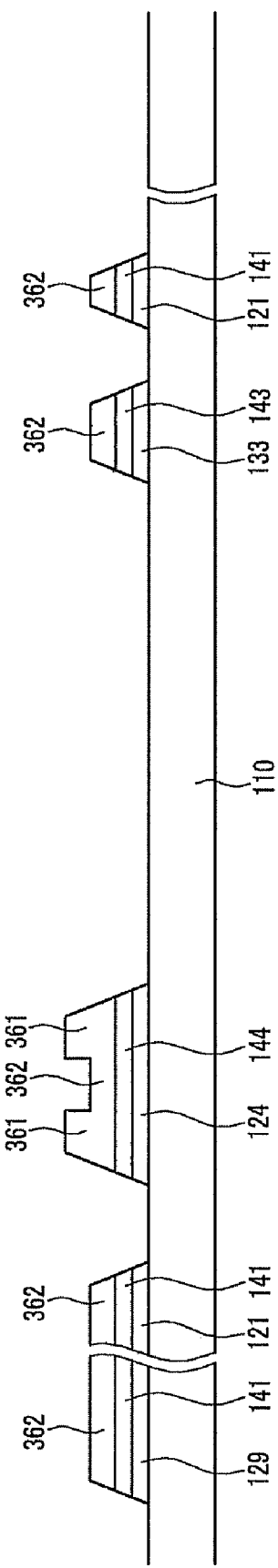
FIG. 6 is a sectional view of the exemplary TFT array panel shown in FIG. 5 taken along line VI-VI.
Figure 7:
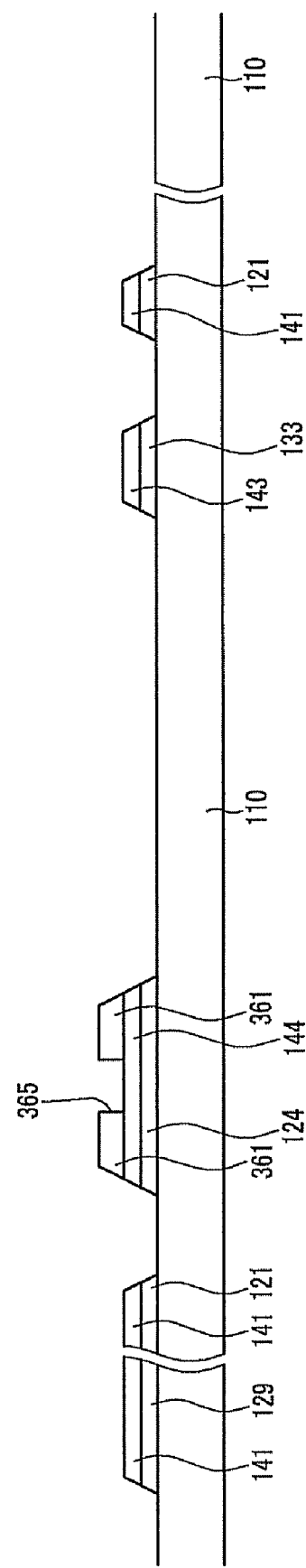
FIG. 7 is a sectional view of the exemplary TFT array panel shown in FIG. 5 and FIG. 6 in the following step of the exemplary manufacturing method thereof.
Figure 8:
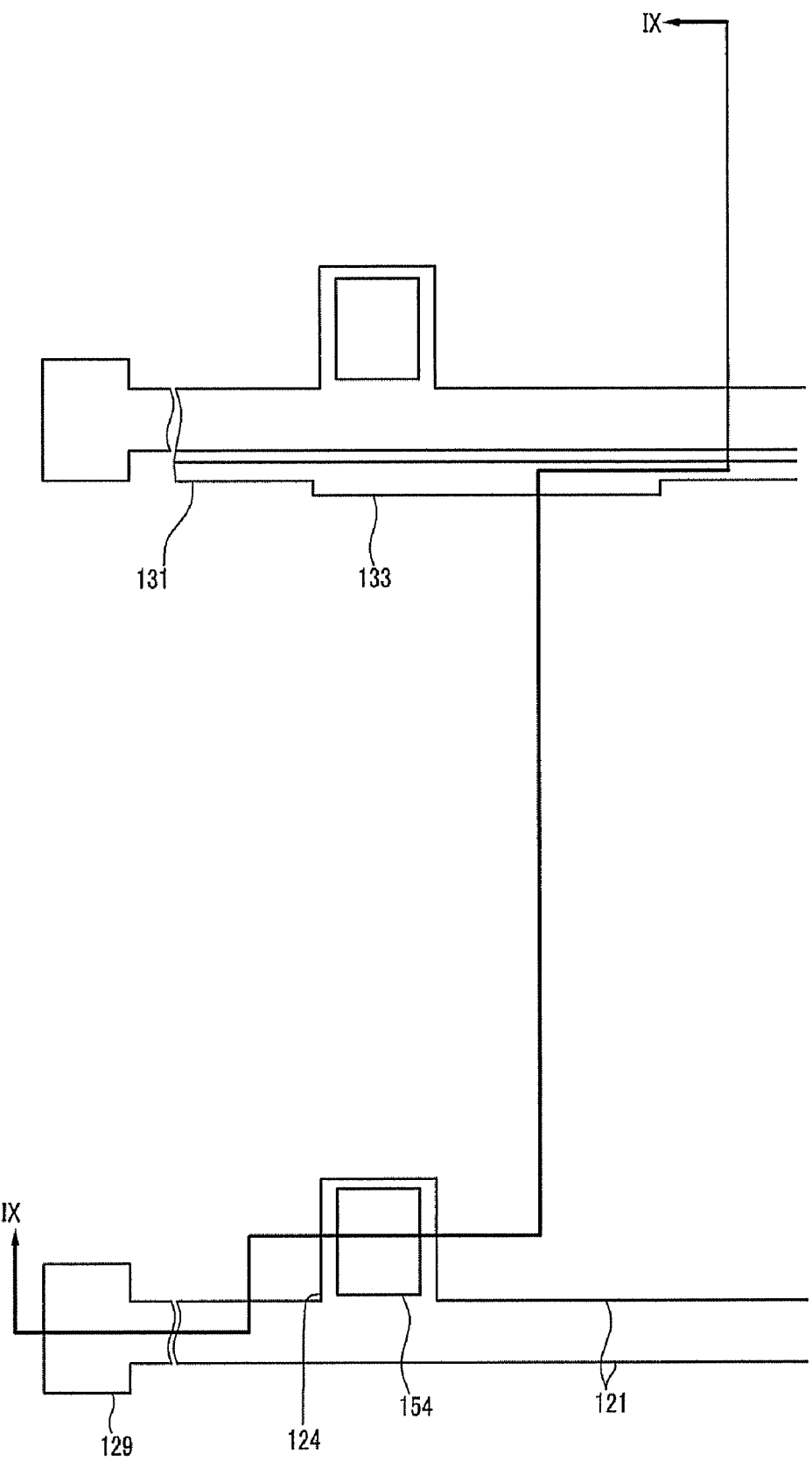
Figure 9:
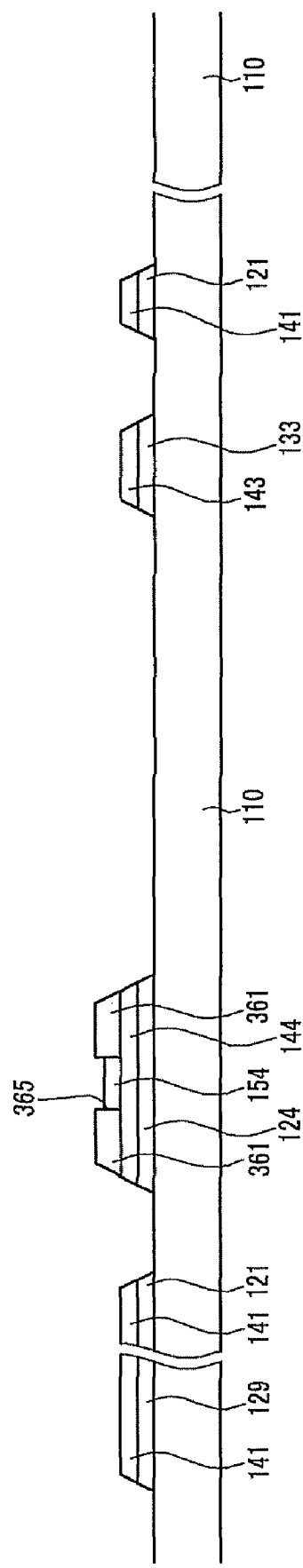
FIG. 9 is a sectional view of the exemplary TFT array panel shown in FIG. 8 taken along line IX-IX.
Figure 14:
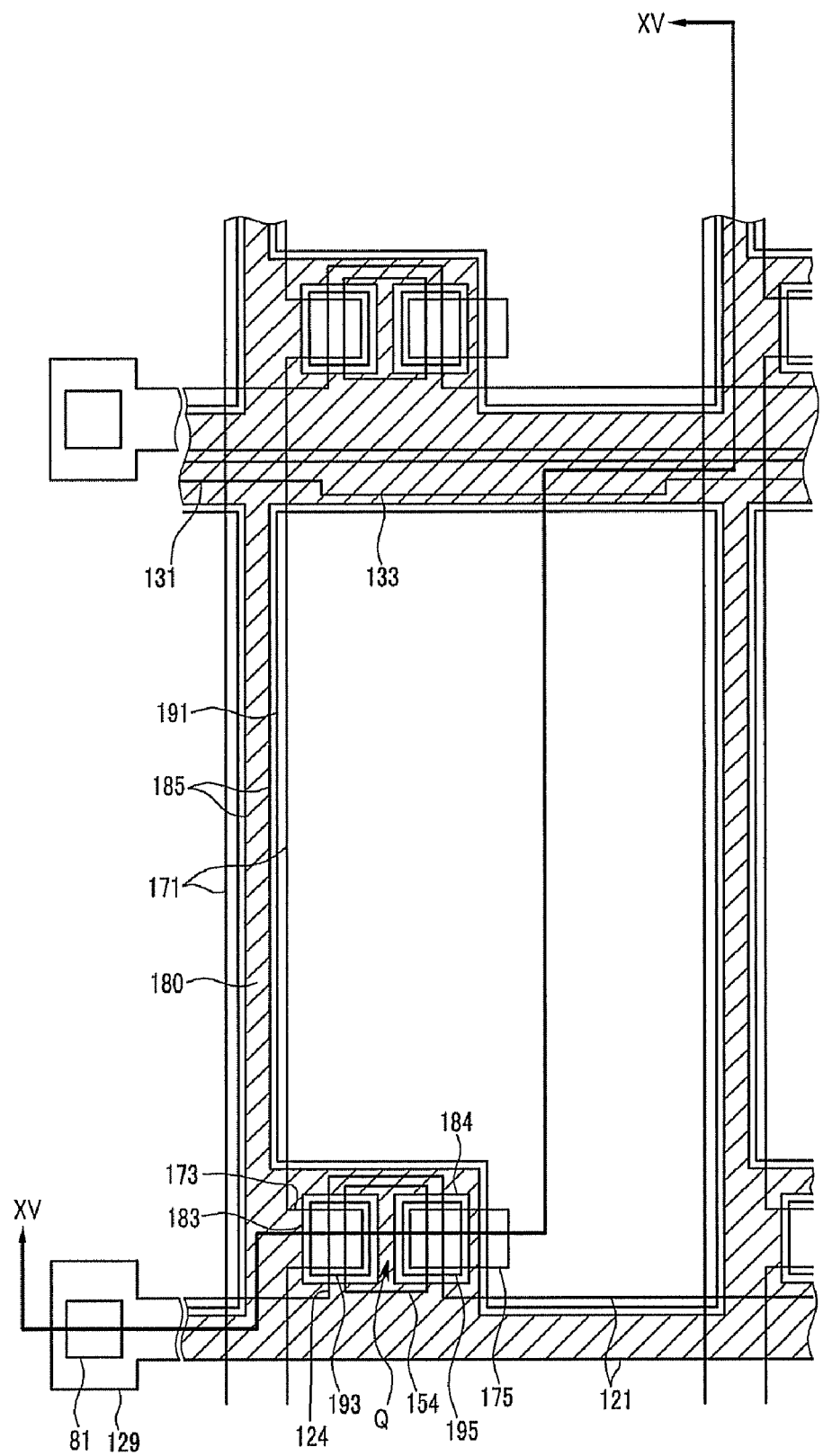
Figure 15:
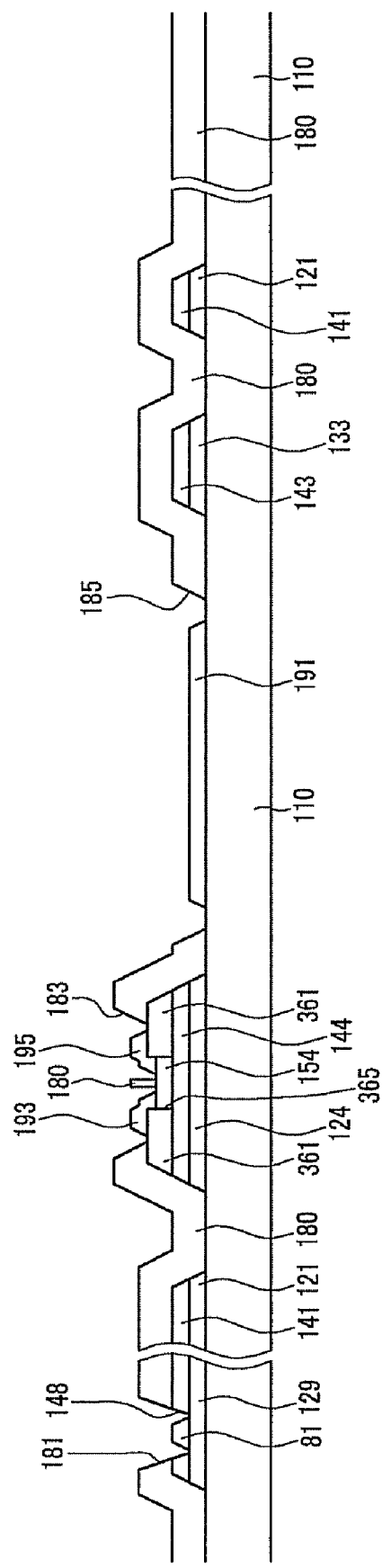
FIG. 15 is a sectional view of the exemplary TFT array panel shown in FIG. 14 taken along line XV-XV.

FIG. 3 and FIG. 4 are cross-sectional views sequentially illustrating an exemplary method of manufacturing the exemplary TFT array panel shown in FIG. 1 and FIG. 2 according to an exemplary embodiment of the present invention. FIG. 5, FIG. 8, and FIG. 14 are layout views sequentially illustrating an exemplary method of manufacturing the exemplary TFT array panel shown in FIG. 4, FIG. 6 is a sectional view of the exemplary TFT array panel shown in FIG. 5 taken along line VI-VI, FIG. 7 is a sectional view of the exemplary TFT array panel shown in FIG. 5 and FIG. 6 in following step of an exemplary manufacturing method thereof, FIG. 9 is a sectional view of the exemplary TFT array panel shown in FIG. 8 taken along line IX-IX, FIG. 10 to FIG. 13 are cross-sectional views sequentially illustrating an exemplary method of manufacturing the exemplary TFT array panel shown in FIG. 8 and FIG. 9, and FIG. 15 is a sectional view of the exemplary TFT array panel shown in FIG. 14 taken along line XV-XV.

First, referring to FIG. 3, a gate conductive layer 120 is deposited on a substrate 110 by sputtering, etc.

Sequentially, a gate insulating layer 140 such as silicon oxide or silicon nitride is deposited on the gate conductive layer 120 and a negative photoresist 360 is coated on the gate insulating layer 140.

An exposure mask 10 is disposed over the photoresist 360 and the photoresist 360 is exposed to light through the exposure mask 10. Here, the exposure mask 10 has translucent areas 10b, as well as light transmitting transparent areas 10a and light blocking opaque areas 10c. The translucent areas 10b may have a slit pattern, a lattice pattern, or a thin film(s) with intermediate transmittance or intermediate thickness. When using a slit pattern, it is preferable that the width of the slits or the distance between the slits is smaller than the resolution of a light exposer used for the photolithography.

The exposure mask 10 is removed and the exposed photoresist 360 is developed. The developed photoresist has a position dependent thickness including first photoresist patterns 361 having a first thickness and second photoresist patterns 362 having a second thickness thinner than the first thickness as shown in FIG. 4. Here, a thickness ratio of the first photoresist patterns 361 to the second photoresist patterns 362 is adjusted depending upon the process conditions in the subsequent process steps. It is preferable that the thickness of the second photoresist patterns 362 is equal to or less than half of the thickness of the first photoresist patterns 361.

Next, the gate conductive layer 120 and the gate insulating layer 140 are etched using the first and second photoresist patterns 361 and 362 as an etching mask to form a plurality of gate lines 121 including gate electrodes 124 and end portions 129, a plurality of storage electrode lines 131 including storage electrodes 133, and a plurality of gate insulating members 141, 143, and 144 as shown in FIG. 5 and FIG. 6.

Referring to FIG. 7, the second photoresist patterns 362 are removed by an etch back process such as ashing to expose the gate insulating members 141 and 143 and to form a plurality of first openings 365 exposing a portion of the gate insulating members 144. At this time, the thickness of the first photoresist patterns 361 thins by a predetermined amount such that a remaining portion of the first photoresist pattern 361 remains on the gate insulating member 144 surrounding the first openings 365.

Referring to FIG. 8 and FIG. 9, a plurality of organic semiconductor islands 154 are formed in the first openings 365. Here, an organic semiconductor liquid is dropped into the first openings 365 by inkjet printing, and then the solvent of the organic semiconductor liquid is dried. The organic semiconductor islands 154 are retained within the first openings 365 by the banks formed by the first photoresist patterns 361.

Figure 10:
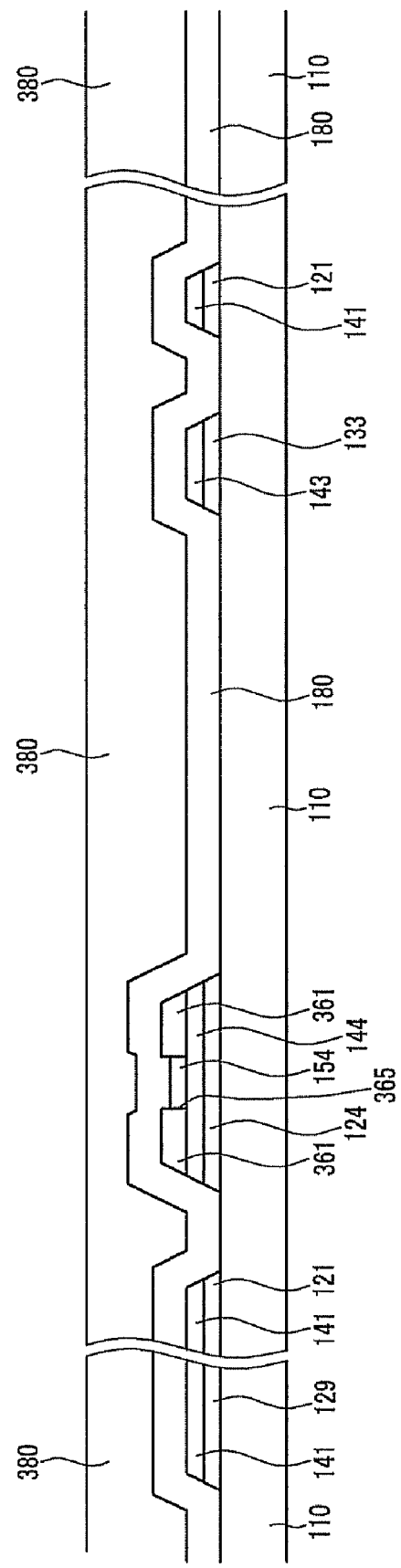
FIG. 10 to FIG. 13 are cross-sectional views sequentially illustrating an exemplary method of manufacturing the exemplary TFT array panel shown in FIG. 8 and FIG. 9.

Referring to FIG. 10, a passivation layer 180 is deposited on the entire surface of the substrate 110 and a positive photoresist 380 is coated on the passivation layer 180.

Figure 11:
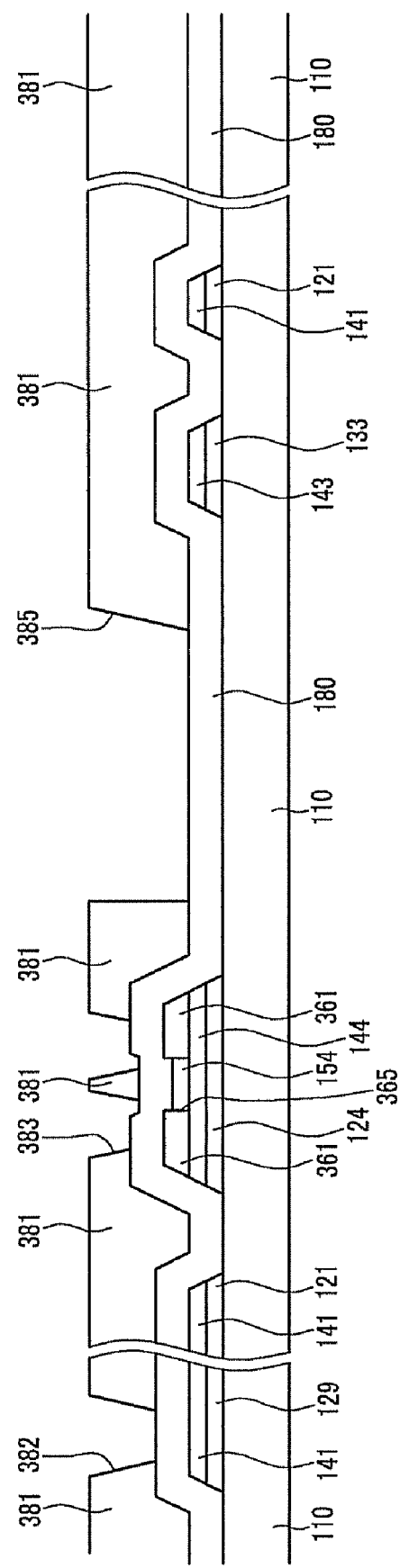

The positive photoresist 380 is exposed and developed to form a plurality of photoresist patterns 381 including a plurality of openings 383 and 385 and a plurality of contact holes 382 as shown in FIG. 11. The openings 383 expose portions of the passivation layer 180 overlapping the photoresist pattern 361, and the openings 385 expose portions of the passivation layer 180 overlapping the insulating substrate 110 between the gate electrodes 124 and the storage electrodes 133. Here, the exposing may be performed using an exposure mask (not shown) having light transmitting transparent areas, translucent areas, and light blocking opaque areas to control thickness of the photoresist patterns 381 easily, such as by forming some portions thinner than other portions and by removing the thinner portions. A portion of the photoresist pattern 381 may overlap the organic semiconductor island 154.

Figure 12:
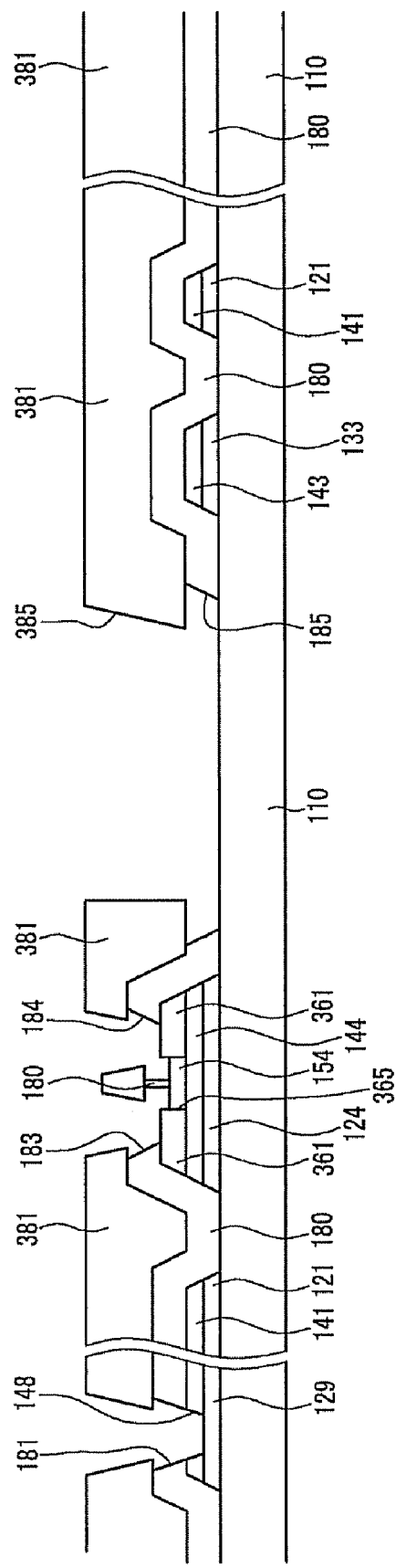

Referring to FIG. 12, the passivation layer 180 and the gate insulating member 141 are etched using the photoresist patterns 381 as an etching mask to form a plurality of second to fourth openings 183, 184, and 185 and a plurality of contact holes 148, 181. The second and third openings 183 and 184 expose portions of the organic semiconductor islands 154 and the photoresist patterns 361, the fourth openings 185 expose the substrate 110 between the gate electrodes 124 and the storage electrodes 133, and the contact holes 148 and 181 expose the end portion 129 of the gate line 121. A portion of the photoresist pattern 381 and a portion of the underlying passivation layer 180 may remain on the organic semiconductor island 154 as shown.

Figure 13:
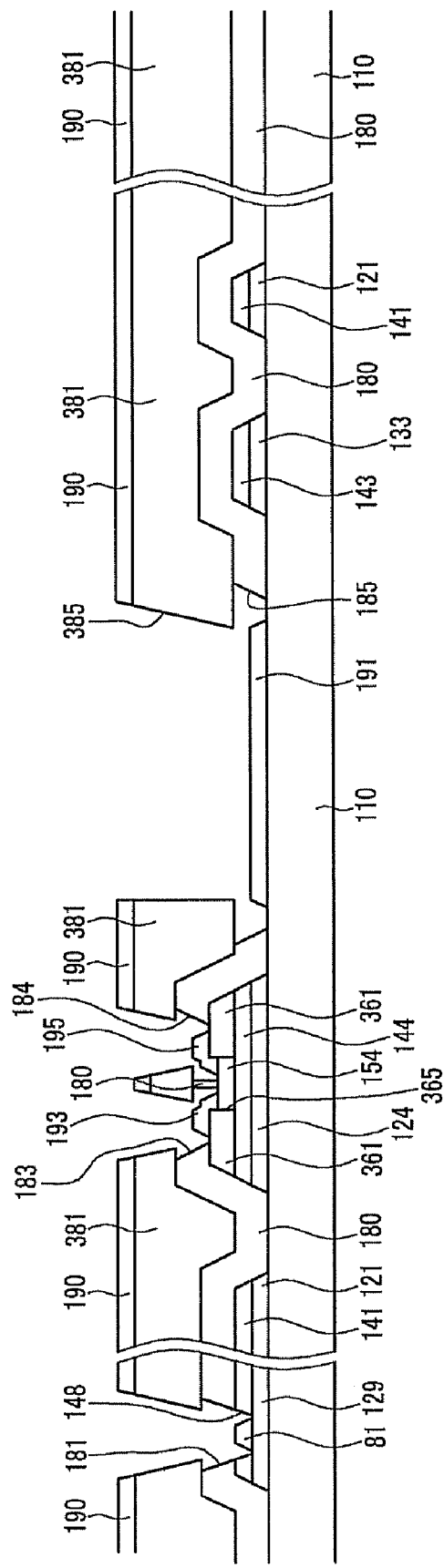

Referring to FIG. 13, a conductive layer such as ITO or IZO is deposited on the entire surface of the resultant structure. Here, step heights between portions having the photoresist patterns 381 and portions having no photoresist pattern 381 are large such that the conductive layer is divided into portions 190 formed on the photoresist patterns 381, portions 81 formed on the end portions 129 of the gate lines 121, portions 193 and 195 formed on the semiconductor islands 154 and adjacent photoresist patterns 361, and portions 191 formed on the substrate 110. The portions 193 and 195 are separated from each other due to the photoresist patterns 381 and the passivation layer 180 that overlap the organic semiconductor islands 154. A small portion 190 of the conductive layer may further be formed on the photoresist pattern 381 on the passivation layer 180 overlapping the semiconductor island 154.

Thereafter, the photoresist patterns 381 are stripped. Here, the portions 190 of the conductive layer formed on the photoresist patterns 381 are removed along with the photoresist patterns 381 by a lift-off process.

Accordingly, as shown in FIGS. 14 and 15, the conductive layer remains as portions 81 formed on the end portions 129 of the gate lines 121, portions 193 and 195 formed on the organic semiconductor islands 154 and partially overlapping the photoresist pattern 361, and portions 191 formed on the substrate 110. The remaining conductive layer forms the contact assistants 81, the connecting members 193 and 195, and the pixel electrodes 191, respectively.

Finally, a data conductive layer is deposited on the entire surface of the resultant structure, such as at room temperature, and then the data conductive layer is patterned by photolithography and etching to form a plurality of data lines 171 including source electrodes 173 and end portions 179, a plurality of drain electrodes 175, and storage capacitor conductors 177 as shown in FIG. 1 and FIG. 2.

As described above, the manufacturing method of the TFT array panel according to an exemplary embodiment of the present invention use only three masks including one mask to form the gate lines 121, as well as other elements from the gate conductive layer, and the photoresist patterns 361, another mask to pattern the passivation layer 180 and the pixel electrodes 191, and a third mask to form the data lines 171, as well as other elements from the data conductive layer. Accordingly, the number of masks is reduced to cut down the manufacturing time and the manufacturing cost of a TFT array panel.

Also, the TFT array panel according to an embodiment of the present invention includes an organic semiconductor, which may be fabricated by a solution process such as inkjet printing, and so can apply to a large-sized flat panel display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method of a thin film transistor array panel, the method comprising:
    forming a first conductive layer on a substrate;
    forming a gate insulating layer on the first conductive layer;
    forming a first insulating layer on the gate insulating layer;
    forming a first insulating pattern including a first opening by patterning the first insulating layer;
    forming a gate insulating member and a gate line by etching the gate insulating layer and the first conductive layer using the first insulating pattern as a mask;
    forming an organic semiconductor in the first opening;
    sequentially forming a passivation layer and a second insulating layer on the organic semiconductor and the first insulating pattern;
    forming a second insulating pattern by patterning the second insulating layer;
    etching the passivation layer using the second insulating pattern as a mask;

depositing a second conductive layer on the second insulating pattern, on portions of the substrate that are exposed through second openings in the etched passivation layer, and on portions of the first insulating pattern and the organic semiconductor that are exposed through third openings in the etched passivation layer;

forming a pixel electrode by removing the second insulating pattern and first portions of the second conductive layer that are located on the second insulating pattern, leaving behind second portions of the second conductive layer that are on the substrate in the second openings in the etched passivation layer, wherein the second portions of the second conductive layer are used as the pixel electrode; and forming a data line including a source electrode, and a drain electrode facing the source electrode by depositing a third conductive layer and patterning the third conductive layer by photolithography and etching.

2. The method of claim 1, wherein forming the first insulating pattern comprises:

forming first portions and second portions that are thinner than the first portions by patterning the first insulating layer; and forming the first opening by removing the second portions.

3. The method of claim 2, wherein forming the first portions and the second portions includes using a slit mask or a half-tone mask.

4. The method of claim 2, wherein forming the first opening includes removing the second portions by ashing.

5. The method of claim 1, wherein the first insulating layer is thicker than the first insulating pattern.

6. The method of claim 1, wherein forming the pixel electrode includes removing the second insulating pattern and the second conductive layer located on the second insulating pattern by lift-off.

7. The method of claim 1, wherein forming the second insulating pattern comprises:

forming third portions and fourth portions that are thinner than the third portions by patterning the second insulating layer; and removing the fourth portions.

8. The method of claim 7, wherein forming the third portions and the fourth portions includes using a slit mask or a halftone mask.

9. The method of claim 1, wherein forming the organic semiconductor includes an inkjet printing process.

10. The method of claim 1, wherein the first insulating layer and the second insulating layer include a photosensitive organic material.

11. The method of claim 10, wherein the first insulating layer includes a negative photosensitive organic material and the second insulating layer includes a positive photosensitive organic material.

12. The method of claim 1, wherein depositing the second conductive layer is performed at room temperature.

* * * * *